(12) United States Patent
Tachibana

(10) Patent No.: US 8,607,733 B2
(45) Date of Patent: Dec. 17, 2013

(54) ATOMIC LAYER DEPOSITION APPARATUS AND ATOMIC LAYER DEPOSITION METHOD

(75) Inventor: Hiroyuki Tachibana, Tamano (JP)

(73) Assignee: Mitsui Engineering & Shipbuilding Co., Ltd., Tokyo (JP)

( * ) Notice: Subject to any disclaimer, the term of this patent is extended or adjusted under 35 U.S.C. 154(b) by 229 days.

(21) Appl. No.: 12/865,763

(22) PCT Filed: Feb. 17, 2009

(86) PCT No.: PCT/JP2009/000634
§ 371 (c)(1),
(2), (4) Date: Aug. 2, 2010

(87) PCT Pub. No.: WO2009/104379
PCT Pub. Date: Aug. 27, 2009

(65) Prior Publication Data
US 2010/0323125 A1    Dec. 23, 2010

(30) Foreign Application Priority Data
Feb. 18, 2008  (JP) .................. 2008-036142

(51) Int. Cl.
*C23C 16/505* (2006.01)
*C23C 16/50* (2006.01)
*C23C 16/44* (2006.01)
*C23C 16/00* (2006.01)

(52) U.S. Cl.
USPC ............... 118/723 IR; 118/723 I; 118/723 R; 118/722; 118/715

(58) Field of Classification Search
None
See application file for complete search history.

(56) References Cited

U.S. PATENT DOCUMENTS

| | | | | |
|---|---|---|---|---|
| 5,017,404 A | * | 5/1991 | Paquet et al. ................. | 427/573 |
| 6,036,878 A | * | 3/2000 | Collins ..................... | 216/68 |
| 6,043,608 A | * | 3/2000 | Samukawa et al. ...... | 315/111.51 |
| 6,077,384 A | * | 6/2000 | Collins et al. ............. | 156/345.29 |
| 6,267,074 B1 | * | 7/2001 | Okumura ............... | 118/723 MP |
| 6,361,707 B1 | * | 3/2002 | Tanaka et al. ................. | 216/69 |
| 6,416,822 B1 | * | 7/2002 | Chiang et al. ................ | 427/561 |
| 6,417,111 B2 | * | 7/2002 | Nishikawa et al. ........... | 438/710 |
| 6,444,084 B1 | * | 9/2002 | Collins ..................... | 156/345.1 |
| 6,524,432 B1 | * | 2/2003 | Collins et al. ............. | 156/345.48 |
| 6,623,596 B1 | * | 9/2003 | Collins et al. ............. | 156/345.48 |

(Continued)

FOREIGN PATENT DOCUMENTS

| | | |
|---|---|---|
| JP | 04-342121 A | 11/1992 |
| JP | 2002-280378 A | 9/2002 |

(Continued)

*Primary Examiner* — Dah-Wei Yuan
*Assistant Examiner* — Jethro Pence
(74) *Attorney, Agent, or Firm* — Global IP Counselors, LLP

(57) ABSTRACT

An atomic layer deposition apparatus includes: a first chamber which is surrounded by walls including a supply hole for the reactive gas formed thereon; a second chamber which is surrounded by walls including a supply hole for a source gas formed thereon; an antenna array which is provided in the first chamber, the antenna array having a plurality of rod-shaped antenna elements provided in parallel respectively to produce the plasma using the reactive gas; a substrate stage which is provided in the second chamber, the substrate being placed on the substrate stage; and a connecting member which connects the first chamber and the second chamber to supply gas containing reactive gas radical from the first chamber to the second chamber, the reactive gas radical being produced using the antenna array.

12 Claims, 5 Drawing Sheets

(56) References Cited

U.S. PATENT DOCUMENTS

| | | | |
|---|---|---|---|
| 6,835,275 B1* | 12/2004 | Grimbergen et al. | 156/345.24 |
| 6,842,658 B2* | 1/2005 | Izawa et al. | 700/121 |
| 7,199,327 B2* | 4/2007 | Moroz et al. | 219/121.41 |
| 7,244,311 B2* | 7/2007 | Fischer | 118/725 |
| 7,294,563 B2* | 11/2007 | Al-Bayati et al. | 438/513 |
| 7,323,231 B2* | 1/2008 | Derderian | 427/576 |
| 7,348,042 B2* | 3/2008 | Chiang et al. | 427/585 |
| 7,396,431 B2* | 7/2008 | Chen et al. | 156/345.33 |
| 7,648,578 B1 | 1/2010 | Itatani et al. | |
| 7,910,495 B2* | 3/2011 | Shiozawa et al. | 438/772 |
| 2001/0050144 A1* | 12/2001 | Nishikawa et al. | 156/345 |
| 2005/0087130 A1* | 4/2005 | Derderian | 118/715 |
| 2006/0156984 A1* | 7/2006 | Nozawa et al. | 118/723 R |
| 2006/0177580 A1* | 8/2006 | Yamazaki et al. | 427/248.1 |
| 2006/0180082 A1* | 8/2006 | Iwamoto et al. | 118/724 |
| 2007/0042119 A1* | 2/2007 | Matthysse et al. | 427/248.1 |
| 2007/0117383 A1* | 5/2007 | Aitchison et al. | 438/680 |
| 2007/0186857 A1* | 8/2007 | Kim et al. | 118/723 R |
| 2008/0017315 A1* | 1/2008 | Fukuchi | 156/345.27 |
| 2009/0291232 A1* | 11/2009 | Washio et al. | 427/569 |

FOREIGN PATENT DOCUMENTS

| | | |
|---|---|---|
| JP | 2002-299319 A | 10/2002 |
| JP | 2003-86581 A | 3/2003 |
| JP | 2004-47634 A | 2/2004 |
| JP | 2006-310813 A | 11/2006 |
| JP | 2007-173824 A | 7/2007 |
| JP | 2007-273773 A | 10/2007 |
| WO | WO-2005-124845 A1 | 12/2005 |

* cited by examiner

ATOMIC LAYER DEPOSITION APPARATUS AND ATOMIC LAYER DEPOSITION METHOD

CROSS-REFERENCE TO RELATED APPLICATIONS

This U.S. National stage application claims priority under 35 U.S.C. §119(a) to Japanese Patent Application No. 2008-036142, filed in Japan on Feb. 18, 2008, the entire contents of which are hereby incorporated herein by reference.

TECHNICAL FIELD

The present invention relates to an atomic layer deposition (hereinafter also abbreviated as ALD (Atomic Layer Deposition)) apparatus that forms a thin film in one or a few atomic layers on a substrate and an atomic layer deposition method.

BACKGROUND ART

In the ALD method that is one of thin-film forming techniques, two kinds of gases composed mostly of elements constituting a film to be formed are alternately supplied onto a deposition target substrate, and formation of a thin film in one or a few atomic layers is repeated plural times on the substrate, thereby forming a film having a desired thickness. For example, a source gas containing Si and an oxidizing gas containing O are used when a $SiO_2$ film is formed on the substrate. A nitrizing gas is used instead of the oxidizing gas when a nitride film is formed on the substrate.

In the ALD method, while the source gas is supplied, the source gas only for one or a few layers is adsorbed into a substrate surface, and the excess source gas does not contribute to the deposition. This is well known as deposition self-stopping action (self-limiting function).

The ALD method advantageously has both high step coverage and film-thickness controllability compared with a generally used CVD (Chemical Vapor Deposition) method, so that the ALD method is expected to be practically applied to formation of a capacitor of a memory element or an insulating film called "high-k gate". Further, since the insulating film can be formed at a low temperature of about 300° C. in the ALD method, the ALD method is also expected to be applied to formation of a gate insulator of a thin-film transistor in a display device such as a liquid crystal display in which a glass substrate is used.

A conventional ALD apparatus will be described below.

FIG. 4 is a schematic diagram illustrating an example of a conventional ALD apparatus. Referring to FIG. 4, an ALD apparatus 70 includes a deposition container (deposition chamber) 12, a gas supply unit 14, and an exhaust unit 16.

The deposition container 12 is formed in a metallic hollow box shape and grounded. In the deposition container 12, an antenna array 28 including plural antenna elements 26 and a substrate stage 32 embedded with a heater 30 are sequentially provided from an upper wall side toward a lower wall side. In the antenna array 28, a virtual plane (array direction) that is formed by the plural antenna elements 26 disposed in parallel to each other at predetermined intervals is provided in parallel with the substrate stage 32.

As illustrated in FIG. 5 that is of a plan view, the antenna element 26 is a rod-shaped monopole antenna (antenna body) 39 made of a conductive material having a length of $(2n+1)/4$ times (n is 0 or a positive integer) a wavelength of high-frequency power, and the antenna element 26 is accommodated in a cylindrical member 40 made of a dielectric material. The high-frequency power generated by a high-frequency power supply unit 34 is distributed by a distributor 36 and supplied to each antenna element 26 through an impedance matching box 38, thereby generating plasma around the antenna element 26.

Each antenna element 26 is disclosed in Japanese Patent Publication Laid-Open No. 2003-86581 proposed by the applicant. Specifically, the antenna element 26 is mounted to a lateral wall of the deposition container 12 while electrically insulated so as to be extended in a direction orthogonal to a gas flow direction of the oxidizing gas supplied toward a substrate stage 32 from a supply hole 20b. The antenna elements 26 are disposed in parallel to each other at predetermined intervals, and the antenna elements 26 are disposed adjacent to each other such that power feeding positions of the antenna elements 26 are located on lateral walls which are on the opposite side from each other.

An operation during the deposition of the ALD apparatus 70 will be described below.

During the deposition, a substrate 42 is placed on an upper surface of the substrate stage 32. The substrate stage 32 is heated with the heater 30, and the substrate 42 placed on the substrate stage 32 is maintained at a predetermined temperature until the deposition is ended.

Specifically, when a $SiO_2$ film is formed on the substrate surface, after the deposition container 12 is horizontally evacuated with the exhaust unit 16, the source gas containing a Si component is horizontally supplied from the gas supply unit 14 into the deposition container 12 through a supply pipe 18a and a supply hole 20a formed in a left wall of the deposition container 12. Therefore, the source gas is supplied to the surface of the substrate 42 and adsorbed. During this process, the plasma is not generated by the antenna element 26.

Next, the supply of the source gas is stopped, and the excess source gas other than source gas adsorbed into the surface of the substrate 42 is horizontally exhausted from the deposition container 12 through an exhaust hole 24 formed in a right wall of the deposition container 12 and an exhaust pipe 22 with the exhaust unit 16.

Subsequently, the oxidizing gas is horizontally supplied from the gas supply unit 14 into the deposition container 12 through a supply pipe 18b and the supply hole 20b formed in the left wall of the deposition container 12. Simultaneously, the high-frequency power is supplied from the high-frequency power supply unit 34 to each antenna elements 26. Therefore, the plasma is generated around each antenna element 26 using the oxidizing gas, and the source gas adsorbed into the surface of the substrate 42 is oxidized.

Then, the supply of the oxidizing gas and the supply of the high-frequency power to the antenna element 26 are stopped, and the excess oxidizing gas that does not contribute to the oxidation and the reaction product are horizontally exhausted through the exhaust hole 24 formed in the right wall of the deposition container 12 and the exhaust pipe 22 with the exhaust unit 16.

Thus, the $SiO_2$ film is formed in one or a few atomic layers on the substrate 42 through a series of processes including the supply of the source gas→the exhaust of the excess source gas→the supply of the oxidizing gas→the exhaust of the excess oxidizing gas. The $SiO_2$ film having a predetermined thickness is formed by repeating the series of processes several times.

Japanese Patent Publication Laid-Open Nos. 2006-310813, 2007-473824, and 2002-280378 can be cited as examples of the prior art document related to the invention.

Japanese Patent Publication Laid-Open No. 2006-310813 proposed by the applicant is a single wafer-type ALD apparatus in which a monopole antenna is disposed as the plasma source in the deposition container. Japanese Patent Publication Laid-Open No. 2007-473824 is a single wafer-type ALD apparatus aimed at a semiconductor wafer, and a shower head and a substrate heater are used as a parallel plate type device. Japanese Patent Publication Laid-Open No. 2002-280378 is a batch-type ALD apparatus aimed at the semiconductor wafer, and a remote plasma method is adopted using parallel electrode.

DISCLOSURE OF THE INVENTION

Problem to be Solved by the Invention

In the method that is disclosed in Japanese Patent Publication Laid-Open No. 2006-310813, when the substrate is a large substrate like a liquid crystal substrate, the shower head and the substrate heater are also enlarged in size to increase a capacity of the deposition container, thereby resulting in a problem for high-speed exhausting and deposition gas exchanging which are necessary for the ALD process.

In the method that is disclosed in Japanese Patent Publication Laid-Open No. 2007-473824, since the plasma source is disposed in the deposition container, a structure in the deposition container becomes complicated (concavo-convex shape), which results in a problem in that the plasma source itself may possibly cause to generate particles. Although Japanese Patent Publication Laid-Open No. 2002-280378 proposes a structure in which a partition wall that isolates the plasma source is also provided, the inside of the deposition container also becomes complicated, which results in the problem in that the plasma source itself may possibly cause to generate particles.

When the plasma source is disposed in the deposition container in order to enhance activity of the deposition gas (the source gas and the oxidizing gas or nitrizing gas) like the conventional ALD apparatus, the structure of the deposition apparatus becomes complicated, which results in a problem in that a maintenance property is degraded. During the deposition, a film or fine particles that are formed as a reaction product may be also deposited on the surface of the plasma source. A part of the film or fine particles deposited on the surface of the plasma source may fall down and unfortunately may form the foreign particles to contaminate the substrate surface, thereby degrading film quality.

To overcome the foregoing problems of the convention, an object of the invention is to provide an atomic layer deposition apparatus and an atomic layer deposition method, which can improve the maintenance property of the deposition container and reduce the contamination caused by the particles even if the reactive gas is activated using the plasma source.

Means for Solving the Problem

To attain the object, the invention provides an atomic layer deposition apparatus for forming a film on a substrate by producing plasma using a reactive gas, the atomic layer deposition apparatus including:

a first chamber which is surrounded by walls, on which a supply hole for the reactive gas is formed;

a second chamber which is surrounded by walls, on which a supply hole for a source gas is formed, the source gas supplied from a gas supply unit, not via the first chamber;

an antenna array which is provided in the first chamber, the antenna array including a plurality of rod-shaped antenna elements provided in parallel respectively to produce the plasma using the reactive gas;

a substrate stage which is provided in the second chamber, the substrate being placed on the substrate stage; and a connecting member which connects the first chamber and the second chamber to supply, from the first chamber to the second chamber, gas containing reactive gas radical produced by the plasma.

The apparatus preferably includes an auxiliary container and a deposition container. The first chamber is a chamber of the auxiliary container and the second chamber is a chamber of the deposition container. The connecting member is a supply pipe which connects an exhaust hole for the gas containing the radical and a supply hole for the gas containing the radical. The exhaust hole is formed in a wall of the auxiliary container, and the supply hole is formed in a wall of the deposition container.

Preferably, the exhaust hole in the auxiliary container is provided in a lateral wall that is opposite to a lateral wall in which the supply hole of the auxiliary container is formed while the antenna array is interposed between the exhaust hole and the supply hole, and the exhaust hole of the auxiliary container is formed at a level so that a level difference is made with respect to a lower wall of the auxiliary container.

The apparatus is preferably provided with an on-off valve that controls communication between the auxiliary container and the deposition container is provided in the supply pipe.

In the apparatus, the substrate stage preferably moves up and down in the deposition container, and a stopper is provided in the second chamber of the deposition container while protruded, the stopper positioning the substrate stage at a predetermined position. A surface on which the substrate is placed in the substrate stage is positioned flush with a surface of the stopper to form a surface with no steps when the film is formed on the substrate.

Alternatively, the apparatus preferably includes a deposition container. In the apparatus, the first and second chambers are respectively chambers in the deposition container, and the connecting member is a partition plate serving as a wall which partitions a space in the deposition container into an auxiliary chamber constituting the first chamber and a deposition chamber constituting the second chamber. The partition plate is provided between the antenna array and the substrate stage with a plurality of holes formed therein.

The plurality of holes formed in the partition plate are preferably formed at a level so that a level difference is made with respect to a lower wall of the auxiliary chamber.

The reactive gas may be an oxidizing gas or a nitrizing gas.

To attain the object, the invention provides an atomic layer deposition method of forming a film on a substrate by producing plasma using a reactive gas, the atomic layer deposition method including the steps of:

supplying a source gas to a second chamber to adsorb a source gas component to the substrate;

feeding power to an antenna array which is provided in a first chamber, the antenna array comprising a plurality of rod-shaped antenna elements provided in parallel respectively, generating plasma using the reactive gas supplied to the first chamber, and supplying gas containing a radical produced by the plasma to the second chamber; and causing the source gas adsorbed on the substrate to react using the gas containing the radical, the gas containing the radical which is supplied to the second chamber.

In the method, the reactive gas may be an oxidizing gas or a nitrizing gas.

According to the invention, the antenna array as a plasma source and the substrate stage on which the substrate is placed are disposed in the chambers separated from each other, respectively. Therefore, the reactive gas can be activated without degrading the maintenance property of the deposition container. That is, because the antenna array is not provided in the deposition container, the structure in the deposition container can considerably reduce the generation of the particles caused by the complicated configuration of the apparatus in which the antenna array is provided, thereby improving the film quality.

BEST MODES FOR CARRYING OUT THE INVENTION

An atomic layer deposition apparatus and an atomic layer deposition method according to an embodiment of the invention will be described in detail with reference to the accompanying drawings.

Figure 1:
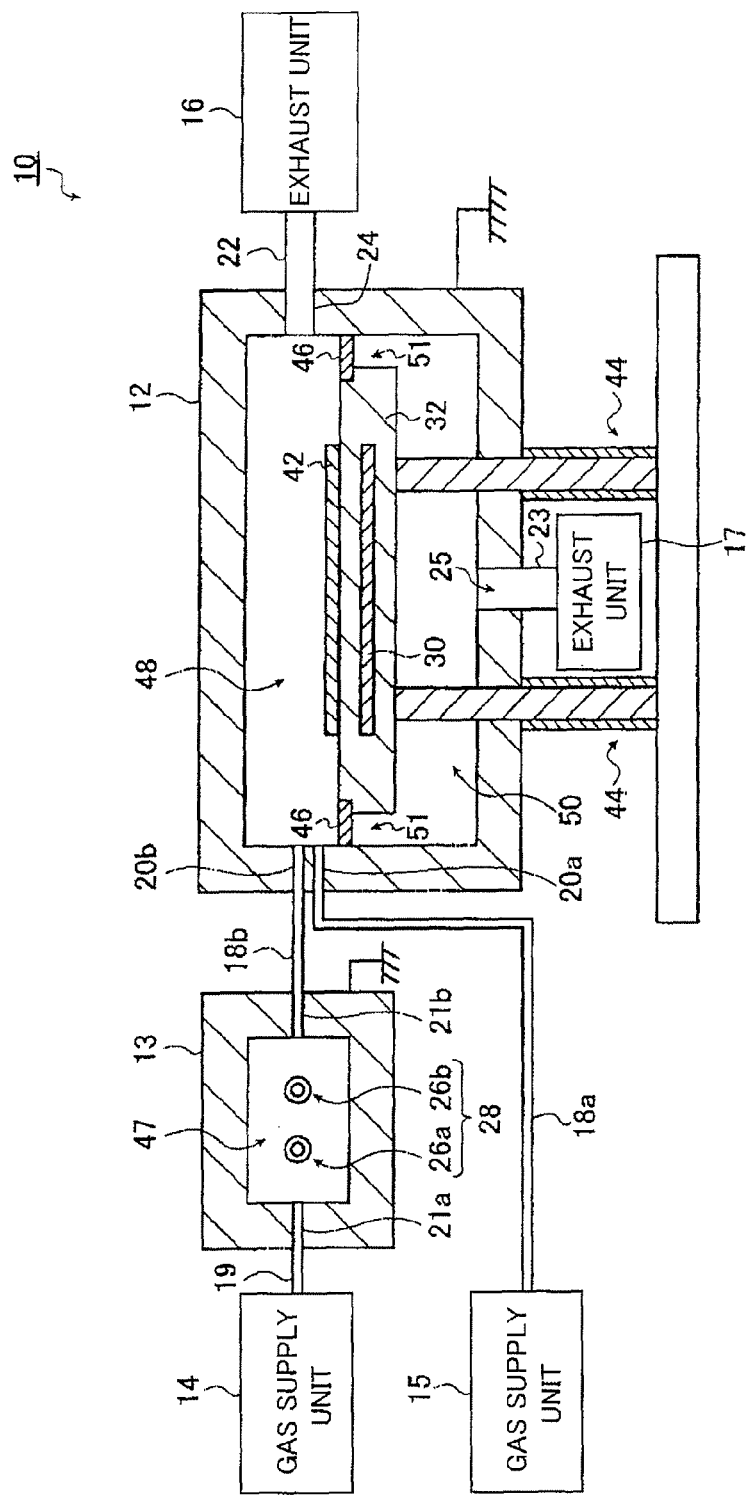
FIG. 1 is a schematic diagram illustrating a configuration of an atomic layer deposition apparatus according to an embodiment of the invention.

FIG. 1 is a schematic diagram illustrating a configuration of an ALD apparatus according to an embodiment of the invention. In an ALD apparatus 10 illustrated in FIG. 1, the ALD method is adopted, and two kinds of deposition gases (the source gas and the oxidizing gas or nitrizing gas) composed mostly of elements constituting the film to be formed are alternately supplied onto the deposition target substrate. During the processing, the plasma is generated in order to enhance the reaction activity, thereby forming the oxide film or nitride film of the source gas in one or a few atomic layers on the substrate. Assuming that one cycle is the above-described processing, the film having the desired thickness is formed by repeating the processing cycle plural times. For example, the reactive gas is the oxidizing gas or nitrizing gas. An oxygen gas can be cited as an example of the oxidizing gas.

The ALD apparatus 10 includes the deposition container 12, an auxiliary chamber 13, gas supply units 14 and 15, and exhaust units 16 and 17 such as a vacuum pump. Although the case in which the oxide film is formed on the substrate 42 is described below by way of example, the same configuration of the ALD apparatus may be employed for the nitride film. The nitrizing gas such as a nitrogen gas is used to form the nitride film.

The gas supply unit 14 is connected to a supply hole 21a formed in one of the lateral walls (the left wall in FIG. 1) of the auxiliary chamber 13 through a supply pipe 19. The gas supply unit 14 horizontally supplies the oxidizing gas such as oxygen gas or ozone gas into the auxiliary chamber 13 (auxiliary chamber 47) through the supply pipe 19 and the supply hole 21a.

The gas supply unit 15 is connected to the supply hole 20a formed in one of the lateral walls (the left wall in FIG. 1) of the deposition container 12 through the supply pipe 18a. The gas supply unit 15 horizontally supplies the source gas into the deposition container 12 through the supply pipe 18a and the supply hole 20a. The source gas and the oxidizing gas are alternately supplied.

On the other hand, the exhaust unit 16 is connected to the exhaust hole 24 formed in one of the lateral walls (the right wall of FIG. 1) of the deposition chamber 48 through the exhaust pipe 22. The exhaust unit 16 horizontally exhausts the source gas and oxygen radical, which are alternately supplied into the deposition chamber 48, through the exhaust hole 24 and the exhaust pipe 22 while pressures in the auxiliary chamber 47 and deposition chamber 48 are kept constant. The exhaust unit 17 is connected to the exhaust hole 25 formed in one of a lower wall of the deposition container 12 (vacuum chamber (load lock chamber) 50 described below) through the exhaust pipe 23. The exhaust unit 17 basically evacuates the vacuum chamber 50 through the exhaust hole 25 and the exhaust pipe 23.

Although not illustrated, an on-off valve (such as an electromagnetic valve) that controls communication between the gas supply unit 14 and the auxiliary chamber 47 is provided midway in the supply pipe 19, and an on-off valve that controls communication between the gas supply unit 15 and the deposition chamber 48 is provided in the middle of the supply pipe 18a. On-off valves that control communication between the exhaust units 16 and 17 and the deposition chamber 48 and vacuum chamber 50 are provided midway in exhaust pipes 22 and 23, respectively.

The on-off valve of the supply pipe 19 is opened when the gas is supplied from the gas supply unit 14 into the auxiliary chamber 47 of the auxiliary container 13, and the on-off valve of the supply pipe 18a is opened when the source gas is supplied from the gas supply unit 15 into the deposition chamber 48 of the deposition container 12. The on-off valve of the exhaust pipe 22 is usually opened, and the gas supplied into the deposition chamber 48 is always exhausted. The on-off valve of the exhaust pipe 23 is opened when the vacuum chamber 50 of the deposition container 12 is evacuated.

An exhaust hole 21b of the auxiliary container 13, which is formed in the lateral wall (the right wall in FIG. 1) that is opposite to the left wall of the deposition container 12, and the supply hole 20b of the deposition container 12, which is formed in the lateral wall (the left wall in FIG. 1) that faces the right wall of the auxiliary container 13, are connected to each other through the supply pipe 18b (connecting member of the invention). The gas containing the oxygen radical (neutral radical of oxygen) that is produced from the oxidizing gas plasma generated with the antenna array 28 in the auxiliary chamber 47 is supplied from the auxiliary chamber 47 into the deposition chamber 48 through the exhaust hole 21b of the auxiliary container 13, the supply pipe 18b, and the supply hole 20b of the deposition container 12.

Mid way in the supply pipe 18b, an on-off valve that controls the communication between the auxiliary chamber 47 and the deposition chamber 48 is also provided. The on-off valve is opened only when the gas containing the oxygen radical is supplied from the auxiliary chamber 47 into the deposition chamber 48. Therefore, when the source gas is supplied from the gas supply unit 15 into the deposition chamber 48, the oxidizing gas and the plasma using the oxidizing gas which remains in the auxiliary chamber 47 can be securely prevented from being supplied into the deposition chamber 48.

The auxiliary container 13 is formed in a metallic hollow box shape and grounded. The antenna array 28 including two antenna elements 26*a* and 26*b* is disposed in the auxiliary container 13 (auxiliary chamber 47). An internal space of the auxiliary container 13 corresponds to the first chamber of the invention that is surrounded by the walls, one of which has the supply hole of the oxidizing gas formed thereon.

Figure 2:
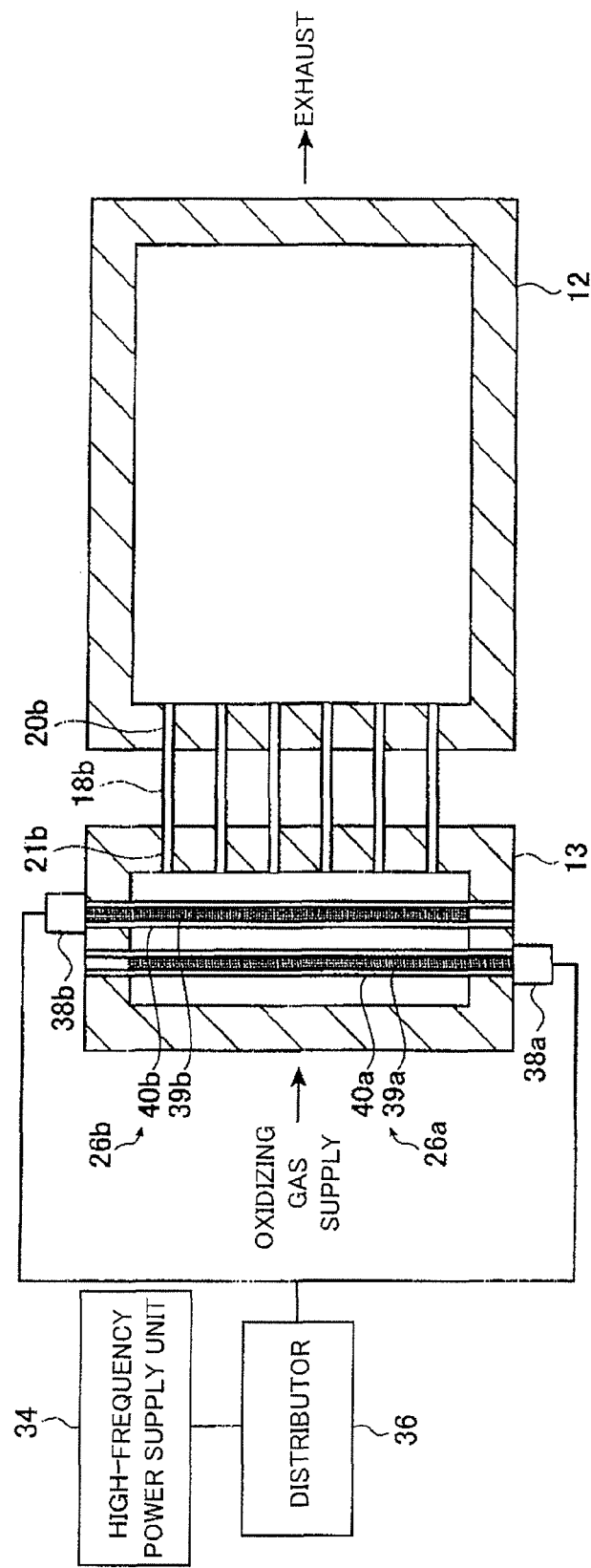
FIG. 2 is a schematic plan view illustrating a configuration of an antenna array of FIG. 1.

As illustrated in a schematic plan view of FIG. 2, the high-frequency power (high-frequency current) of the VHF band (for example, 80 MHz) generated by the high-frequency power supply unit 34 is distributed by the distributor 36 and supplied to the antenna elements 26*a* and 26*b* through impedance matching boxes 38*a* and 38*b*. The impedance matching boxes 38*a* and 38*b* are used to correct impedance mismatch caused by changes in loads of the antenna elements 26*a* and 26*b* during the generation of the plasma, while the frequency of the high-frequency power generated by the high-frequency power supply unit 34 is adjusted.

Specifically, the antenna elements 26*a* and 26*b* are formed of rod-shaped monopole antennas (antenna bodies) 39*a* and 39*b* made of a conductive material such as copper, aluminum, and platinum and cylindrical members 40*a* and 40*b* made of a dielectric material such as quartz and ceramics, the antenna bodies 39*a* and 39*b* located in the cylindrical members 40*a* and 40*b*, respectively. The antenna bodies 39*a* and 39*b* are coated with the dielectric material to adjust the capacitance and inductance as the antenna, so that the high-frequency power can efficiently be propagated along a longitudinal direction of the antenna bodies 39*a* and 39*b* to efficiently radiate an electromagnetic wave from the antenna elements 26*a* and 26*b* to the surroundings.

Each of the antenna elements 26*a* and 26*b* is extended in a direction orthogonal to the gas flow direction of the oxidizing gas supplied from the gas supply unit 14 into the auxiliary chamber 47, and each of the antenna elements 26*a* and 26*b* is mounted on the lateral wall of the auxiliary container 13 while electrically insulated. The antenna elements 26*a* and 26*b* are disposed in parallel to each other at a predetermined interval, for example, at an interval of 50 mm and power feeding positions of the antenna elements 26*a* and 26*b* disposed adjacent to each other are located in the lateral walls that are opposite to each other (power feeding directions become reverse). Therefore, the electromagnetic wave is evenly formed over the whole virtual plane of the antenna array 28.

Electric field intensity in the longitudinal direction of the antenna elements 26*a* and 26*b* becomes zero at a supply end of the high-frequency power, and the electric field intensity becomes the maximum at a leading end portion (a reverse end of the supply end). Accordingly, the power feeding positions of the antenna elements 26*a* and 26*b* are disposed in the lateral walls that are opposite each other, and the high-frequency powers are supplied to the antenna elements 26*a* and 26*b* from the directions opposite to each other, respectively, whereby the electromagnetic waves radiated from the antenna elements 26*a* and 26*b* are combined to form the uniform plasma.

The antenna elements 26*a* and 26*b* are disposed in parallel with the gas flow direction of the oxidizing gas, and the array direction of the antenna elements 26*a* and 26*b* is also parallel to the gas flow direction of the oxidizing gas.

The antenna elements 26*a* and 26*b* are proposed in Patent Publication Laid-Open No. 2003-86581 by the applicant. For example, each of the antenna bodies 39*a* and 39*b* has a diameter of about 6 mm, and each of the cylindrical members 40*a* and 40*b* has a diameter of about 12 mm. Assuming that the high-frequency power of about 1500 W is supplied from the high-frequency power supply unit 34 while the deposition chamber 48 controlled under the pressure of about 20 Pa, when antenna lengths of the antenna elements 26*a* and 26*b* are equal to $(2n+1)/4$ times (n is zero or a positive integer) the wavelength of the high-frequency power, a standing wave is produced to generate resonance, and the plasma is generated around the antenna elements 26*a* and 26*b*.

During the deposition, the high-frequency power is supplied from the high-frequency power supply unit 14 to each of the antenna elements 26*a* and 26*b* only when the oxidizing gas is supplied from the gas supply unit 44 to the auxiliary chamber 47. At this point, in the auxiliary container 13 (auxiliary chamber 47), the plasma is generated with the antenna array 28 using the oxidizing gas supplied from the gas supply unit 14, the gas containing the oxygen radical (the neutral radical of oxygen) produced by the plasma is supplied into the deposition chamber 48 through the supply pipe 18*b* like the remote plasma method, and the gas diffuses over the whole region of the substrate 42.

The use of the antenna array 28 stably generates the high-density plasma, and the gas containing the oxygen radical can substantially evenly be supplied to the large-area of the substrate 42, thereby enabling an enhancement of the oxidation reaction activity in the deposition by the ALD method.

The antenna array 28 as a plasma source and the substrate stage 32 on which the substrate 42 is placed are disposed in the spaces separated from each other, respectively. Therefore, the oxidizing gas can be activated without degrading the maintenance property of the deposition container 12. That is, because the antenna array 28 is not disposed in the deposition container 12, the generation of particles caused by the complication of the apparatus configuration due to disposing the antenna array 28 therein, can considerably be reduced, thereby improving the deposition quality in a structure of the deposition container 12.

Even if the substrate is a large substrate such as a liquid crystal substrate, since the antenna array 28 is not provided in the deposition container 12, the deposition container 12 can be miniaturized (thinned) and the high-speed evacuation and the deposition gas exchange, which are necessary for the ALD process, can be performed.

Since the antenna elements 26*a* and 26*b* can be placed in a narrow space, it is not necessary to widen the space (auxiliary chamber 47) of the auxiliary container 13. Therefore, an installation area and cost of the whole apparatus can be reduced compared with the case in which another type plasma source such as a parallel plate type plasma source is installed. Further, the space in which the antenna array 28 is placed is not required in the deposition container 12, so that the deposition container 12 can also be thinned to achieve the cost reduction.

The exhaust hole 21*b* of the auxiliary container 13 (auxiliary chamber 47) is formed in the lateral wall (the right wall in FIG. 1) that is opposite to the lateral wall (the left wall in FIG. 1) in which the supply hole 21*a* of the auxiliary container 13 is formed while the antenna array 28 is interposed between both of the above walls. The exhaust hole 21*b* is located at a level so that a level difference is made with respect to the lower wall of the auxiliary container 13. Since a transport distance (transport time) of the plasma diffusing around the antenna array 28 is lengthened by the level difference, the charged plasma can be prevented from being supplied from the auxiliary chamber 47 into the deposition chamber 48 to promote the supply of the neutral radical of oxygen produced from the charged plasma. Therefore, the plasma damage of the film formed on the substrate 42 can considerably be reduced.

The deposition container 12 is formed in a metallic hollow box shape and grounded. The substrate stage 32 in which the heater 30 is incorporated is horizontally disposed between the upper wall and the lower wall in the internal space of the deposition container 12. The internal space of the deposition container 12 corresponds to the second chamber of the invention that is surrounded by walls including the supply hole of the source gas formed thereon.

The substrate stage 32 has a size smaller than that of an inner wall surface of the deposition container 12. Specifically, the substrate stage 32 is formed by a rectangular metallic plate and vertically moves up and down by a lifting mechanism 44 such as a power cylinder. A heater stopper (that is, a stopper for the substrate stage 32) 46 that protrudes from the inner wall surface of the lateral wall toward a center portion is provided in the deposition container 12. A L-shaped step is provided on an upper surface of the edge of the substrate stage 32. The L-shaped step corresponds to a height of a side surface of the heater stopper 46.

When the substrate stage 32 moves up, the lower surface of the heater stopper 46 abuts on the stepped portion on the upper surface of the edge of the substrate stage 32, a level of the upper surface of the substrate stage 32 is positioned so as to become substantially identical to (flush with) a level of the upper surface in the heater stopper 46, thereby forming a surface with not step formed thereon. At this point, the inside of the deposition container 12 is divided into the deposition chamber 48 as a space above the substrate stage 32 and the vacuum chamber 50 as a space below the substrate stage 32, and the vacuum chamber 50 is evacuated with the exhaust unit 17 to tightly close the deposition chamber 48. The surface with no step is formed between the substrate stage 32 and the heater stopper 46, so that the gas flowing above the substrate does not generate turbulence, to form the oxide film evenly on the substrate.

That is, as illustrated in FIG. 1, the upper wall of the deposition chamber 48 is formed flat, and the lower surface of the deposition chamber 48 including the upper surface of the substrate stage 32 is formed so as to become flush when a predetermined film on the substrate 42 is formed. It is not necessarily required that the upper wall of the deposition chamber 48 be formed flat. However, preferably the upper wall of the deposition chamber 48 is formed flat from the viewpoint of the formation of the even oxide film on the substrate.

On the other hand, when the substrate stage 32 moves down, a gap 51 with a predetermined size is formed between the lower surface of the heater stopper 46 and the step portion on the upper surface of the edge of the substrate stage 32. The deposition gas supplied into the deposition chamber 48 can be also exhausted from the gap 51 or from both the gap 51 and the exhaust hole 24 by moving down the substrate stage 32, when the source gas and the like supplied to the deposition chamber 48 is exhausted. Since the size of the gap 51 is larger than that of the exhaust hole 24, the deposition gas can be exhausted from the deposition chamber 48 at a high speed.

An operation during the deposition of the ALD apparatus 10, that is, the atomic layer deposition method will be described below. The case in which the $SiO_2$ film (oxide film) is formed on the surface of substrate 42, 370 mm long by 470 mm wide, will be described by way of example.

When the film is formed, the substrate stage 32 moves down by the lifting mechanism 44, and the substrate 42 is placed on the upper surface of the substrate stage 32 in the vacuum chamber 50. Then, the substrate stage 32 moves up to the position at which the upper surface of the edge of the substrate stage 32 abuts on the lower surface of the heater stopper 46, and the vacuum chamber 50 is evacuated with the exhaust unit 17 to tightly close the deposition chamber 48. The substrate stage 32 is heated with the heater 30, and the substrate 42 placed on the substrate stage 32 is maintained at a predetermined temperature, for example, at about 400° C. until the deposition is ended.

After the deposition chamber 48 is horizontally evacuated with the exhaust unit 16 to control the pressure of the deposition chamber 48 to be about 2 to about 3 Pa, the source gas containing Si is horizontally supplied from the gas supply unit 15 into the deposition chamber 48 for about one second to control the pressure of the deposition chamber 48 to be about 20 Pa. Therefore, the source gas is adsorbed into the surface of the substrate 42. During the process, the plasma is not generated by the antenna element 26.

Next, the supply of the source gas is stopped, and the excess source gas other than the source gas adsorbed to the surface of the substrate 42 is horizontally exhausted for about one second from the deposition chamber 48 with the exhaust unit 16. At this point, the source gas supplied into the deposition chamber 48 may be exhausted with the exhaust unit 16 while the purge gas (inert gas) is supplied into the deposition chamber 48 from the gas supply unit 15 through the supply pipe 18*a* and the supply hole 20*a*.

Subsequently, the oxidizing gas is horizontally supplied for about one second from the gas supply unit 14 into the auxiliary chamber 47. Simultaneously, the high-frequency power supply unit 34 supplies the high-frequency power of about 1500 W to each of the antenna elements 26*a* and 26*b*. Therefore, the plasma is generated around the antenna elements 26*a* and 26*b* using the oxidizing gas, and the oxygen radical is generated from the plasma. The gas containing the oxygen radical is supplied from the auxiliary chamber 47 into the deposition chamber 48 to diffuse over the whole region of the surface of the substrate 42, and the source gas adsorbed to the surface of the substrate 42 is oxidized to form the $SiO_2$ film.

Then, the supply of the oxidizing gas and the supply of the high-frequency power to the antenna elements 26*a* and 26*b* (that is, the generation of the plasma) are stopped, and the excess oxidizing gas or plasma that does not contribute to the oxidation in the auxiliary chamber 47 and the reaction product in the deposition chamber 48 are horizontally exhausted for about one second by the exhaust unit 16. During the process, the oxidizing gas may be exhausted from the auxiliary chamber 47 and deposition chamber 48 by the exhaust unit 16 while the purge gas is supplied into the deposition chamber 48 from the gas supply unit 14 through the supply pipe 19, the auxiliary chamber 47, and the supply pipe 18*b*.

As described above, the $SiO_2$ film is formed on the substrate 42, step by step formed in one or a few atomic layers as a unit, through the series of processing including the supply of the source gas→the exhaust of the excess source gas→the supply of the oxidizing gas→the exhaust of the excess oxidizing gas. The $SiO_2$ film having a predetermined thickness is formed on the substrate 42 by repeating the series of the processing plural times.

There is no limitation to the film formed in the invention. The source gas should appropriately be determined according to the film to be formed.

For example, an oxidizing gas containing O is used as one of the reactive gases when the oxide film is formed on the substrate, and a nitrizing gas containing N is used as one of the reactive gases when the nitride film is formed. When the oxide film is formed, the source gas is the reactive gas that is mainly composed of an element except O among elements constituting the oxide film to be formed. When the nitride film is formed, the source gas is the reactive gas that is mainly composed of an element except N among elements constituting the nitride film to be formed.

The source gas may be supplied to the substrate from the lateral wall side of the deposition container or supplied to the substrate from the upper wall side of the deposition container. When the source gas is vertically supplied from the upper wall side of the deposition container, desirably a shower head is provided in the space between the upper wall of the deposition container and the source gas is controlled to diffuse evenly but not to blow directly to (strike on) the substrate.

On the other hand, the source gas may be exhausted from the lateral wall side of the deposition container, from the lower wall side, or from both the lateral wall side and the lower wall side.

In FIG. 2, the auxiliary chamber 47 and the deposition chamber 48 are connected through six supply pipes 18b that supply the oxidizing gas. However, there is no limitation to the number of supply pipes 18b. There is also no limitation to the numbers of supply pipes and exhaust pipes of the source gas.

When the film is formed on the substrate, the pressure, temperature, processing time, and gas flow rate in the deposition container should appropriately be determined according to the kind of the film to be formed, the sizes of the deposition container and substrate, and the like, and the invention is not limited to the embodiment. There is no limitation to the materials, shapes, and sizes of the deposition container and substrate stage.

There is no limitation to the number of antenna elements. However, in consideration of the evenness of the generated plasma, desirably the antenna elements are disposed such that the power feeding positions of the adjacent antenna elements are located in the lateral walls that are opposite each other. There is no limitation to the disposition and size of the antenna element.

Figure 5:
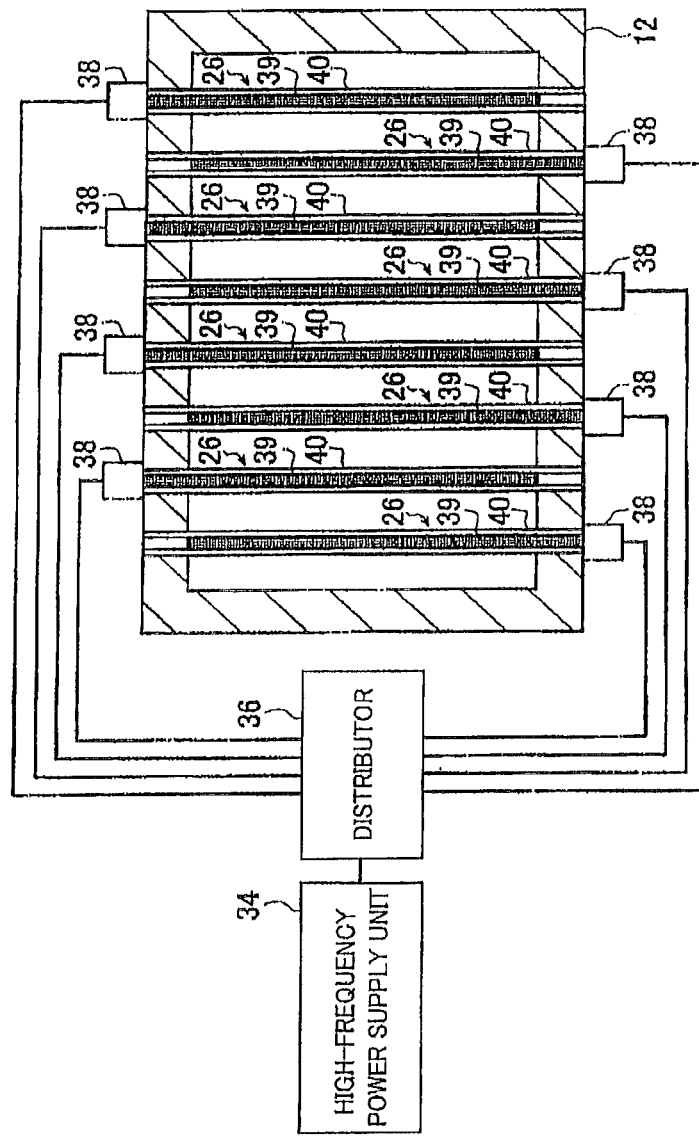
FIG. 5 is a schematic plan view illustrating a configuration of an antenna array of FIG. 4.

For example, the plural antenna elements may horizontally be disposed in a row as illustrated in FIG. 1, or the antenna elements may vertically be disposed in a column as illustrated in FIG. 5. The antenna elements may horizontally be disposed while divided into at least two rows, or the antenna elements may vertically be disposed while divided into at least two columns. In this case, in the rows or columns of the antenna elements, desirably the positions of the adjacent antenna elements are alternately located.

Figure 3:
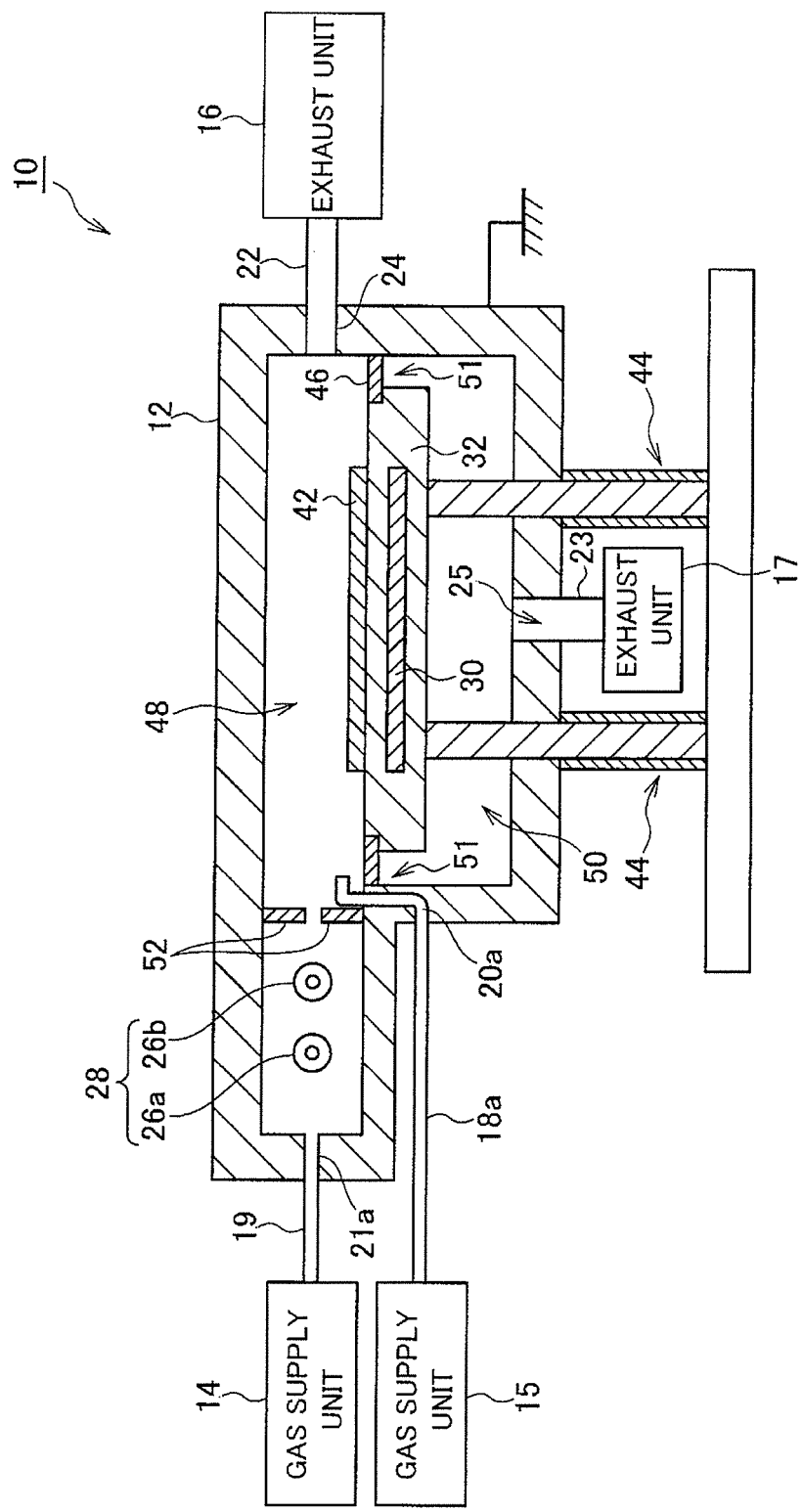
FIG. 3 is a schematic diagram illustrating an atomic layer deposition apparatus according to another embodiment of the invention.
Figure 4:
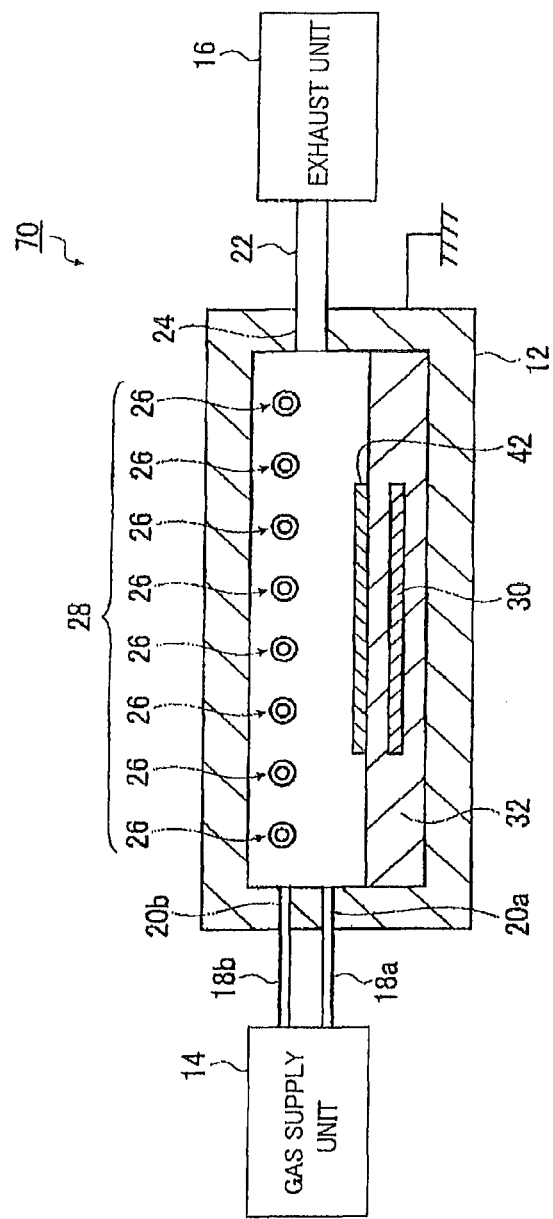
FIG. 4 is a schematic diagram illustrating an example of a conventional atomic layer deposition apparatus.

Instead of providing the antenna array in the auxiliary container, as illustrated in FIG. 3, a partition plate 52 may be provided between the antenna array 28 and the substrate stage 32. The partition plate 52 partitions the deposition container (deposition chamber 48 illustrated in FIG. 1) into the auxiliary chamber constituting the first chamber of the invention and the deposition chamber constituting the second chamber of the invention. In this case, the partition plate 52 in which plural holes are formed to supply the gas containing the neutral radical from the auxiliary chamber into the deposition chamber is used like a shower head. Desirably the plural holes formed in the partition plate 52 are located at a level so that a level difference is made with respect to the lower wall of the auxiliary chamber.

In the ALD apparatus 50 of the invention, it is not necessarily required to provide the lifting mechanism 44 and the vacuum chamber 50. When the ALD apparatus 50 does not include the lifting mechanism 44 and the vacuum chamber 50, the deposition container 12 constitutes the deposition chamber 48.

The invention is basically as described above. Although the atomic layer deposition apparatus is described in detail, the invention is not limited to the embodiment, and obviously various improvements and modifications may be made without departing from the scope of the invention.

The invention claimed is:

1. An atomic layer deposition apparatus for forming a film on a substrate by producing plasma using a reactive gas, the atomic layer deposition apparatus comprising:
    a first chamber which is surrounded by walls, on which a first supply hole for the reactive gas is formed;
    a second chamber which is surrounded by walls, on which a second supply hole for a source gas is formed;
    an antenna array which is provided in the first chamber, the antenna array including a plurality of rod-shaped antenna elements provided in parallel respectively to produce the plasma using the reactive gas;
    a substrate stage which is provided in the second chamber, the substrate being placed on the substrate stage;
    a connecting member which connects the first chamber and the second chamber to supply, from the first chamber to the second chamber, gas containing reactive gas radical produced by the plasma;
    a first gas supply unit connecting through a first pipe to the first chamber and being configured to supply the reactive gas to the first chamber; and
    a second gas supply unit connecting through a second pipe to the second chamber and being configured to supply the source gas to the second chamber, the gas containing the reactive gas radical produced by the plasma using the reactive gas, and the source gas being alternately supplied to the second chamber.

2. The atomic layer deposition apparatus according to claim 1, further comprising:
    an auxiliary container and a deposition container,
    wherein the first chamber is a chamber of the auxiliary container, the second chamber is a chamber of the deposition container,
    and wherein the connecting member is a third supply pipe which connects an exhaust hole for the gas containing the reactive gas radical and a third supply hole for the gas containing the reactive gas radical, the exhaust hole being formed in a wall of the auxiliary container, the third supply hole being formed in a wall of the deposition container, and the third supply pipe allowing the gas containing the reactive gas radical to flow from the auxiliary container to the deposition container.

3. The atomic layer deposition apparatus according to claim 2, wherein the exhaust hole in the auxiliary container is provided in a lateral wall that is opposite to a lateral wall in which the first supply hole of the auxiliary container is formed while the antenna array is interposed between the exhaust hole and the first supply hole, and
    the exhaust hole of the auxiliary container is formed at a level so that a level difference is made with respect to a lower wall of the auxiliary container.

4. The atomic layer deposition apparatus according to claim 2, wherein an on-off valve that controls communication between the auxiliary container and the deposition container is provided in the third supply pipe.

5. The atomic layer deposition apparatus according to claim 2,
    wherein the substrate stage is configured to move up to an upper position and down to a lower position in the deposition container,
    a stopper is provided in the second chamber of the deposition container while protruded, the stopper positioning the substrate stage at a predetermined position,
    and wherein a surface on which the substrate is placed in the substrate stage is positioned flush with a surface of the stopper to form a surface with no steps when the substrate stage is at the upper position.

6. The atomic layer deposition apparatus according to claim 1, further comprising a deposition container, wherein the first and second chambers are respectively chambers in the deposition container, the connecting member is a partition plate serving as a wall which partitions a space in the deposition container into an auxiliary chamber constituting the first chamber and a deposition chamber constituting the second chamber, the partition plate being provided between the antenna array and the substrate stage, and wherein a plurality of holes are formed in the partition plate.

7. The atomic layer deposition apparatus according to claim 6, wherein the plurality of holes formed in the partition plate are formed at a level so that a level difference is made with respect to a lower wall of the auxiliary chamber.

8. The atomic layer deposition apparatus according to claim 1, wherein the reactive gas is an oxidizing gas or a nitrizing gas.

9. The atomic layer deposition apparatus according to claim 1, wherein each of the rod-shaped antenna elements is extended in a direction orthogonal to a gas flow direction of the reactive gas which is supplied to the first chamber through the first supply hole for the reactive gas, an array plane on which the rod-shaped antenna elements are disposed is in parallel with the gas flow direction, and power feeding positions of rod-shaped antenna elements adjacent to each other are located in the walls opposite to each other in the first chamber.

10. An atomic layer deposition method of forming a film on a substrate by producing plasma using a reactive gas, the atomic layer deposition method comprising the steps of:

supplying a source gas to a second chamber from a second gas supply unit connecting through a second pipe to the second chamber to adsorb a source gas component to the substrate;

feeding power to an antenna array which is provided in a first chamber, the antenna array comprising a plurality of rod-shaped antenna elements provided in parallel respectively, generating plasma using the reactive gas supplied to the first chamber from a first gas supply unit connecting through a first pipe to the first chamber, and supplying gas containing a radical produced by the plasma from the first chamber to the second chamber after the source gas is supplied to the second chamber; and causing the source gas adsorbed on the substrate to react with the gas containing the radical, the gas containing the radical which is supplied to the second chamber, wherein the gas containing the radical produced by the plasma and the source gas are alternately supplied to the second chamber.

11. The atomic layer deposition method according to claim 10, wherein the reactive gas is an oxidizing gas or a nitrizing gas.

12. The atomic layer deposition method according to claim 10, wherein the reactive gas is supplied to the first chamber in a direction orthogonal to an extending direction of the rod-shaped antenna elements, the reactive gas in the first chamber is directed in parallel with an array plane on which the rod-shaped antenna elements are disposed, power feeding positions of rod-shaped antenna elements adjacent to each other are located in the walls opposite to each other, and the power is fed to rod-shaped antenna elements adjacent to each other in opposite directions.

* * * * *